(12) United States Patent
Yun et al.

(10) Patent No.: US 6,969,650 B2
(45) Date of Patent: Nov. 29, 2005

(54) METHODS OF FORMING GATE STRUCTURES IN NONVOLATILE MEMORY DEVICES HAVING CURVED SIDE WALLS FORMED USING OXYGEN PATHWAYS

(75) Inventors: Jae-sun Yun, Gyeonggi-do (KR); Jin-hyun Shin, Kyounggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/629,280

(22) Filed: Jul. 29, 2003

(65) Prior Publication Data

US 2004/0046206 A1 Mar. 11, 2004

(30) Foreign Application Priority Data

Sep. 10, 2002 (KR) .................................. 10-2002-0054460

(51) Int. Cl.[7] .......................................... H01L 21/336
(52) U.S. Cl. ...................................... 438/257; 257/315
(58) Field of Search ........................... 257/315; 438/257

(56) References Cited

U.S. PATENT DOCUMENTS

| | | | |
|---|---|---|---|
| 5,208,174 A | | 5/1993 | Mori |
| 6,027,971 A | * | 2/2000 | Cho et al. ................. 438/257 |
| 6,030,869 A | * | 2/2000 | Odake et al. .............. 438/266 |
| 6,232,184 B1 | * | 5/2001 | Wang et al. ............... 438/265 |
| 2002/0106859 A1 | * | 8/2002 | Odake et al. .............. 438/264 |
| 2002/0187609 A1 | * | 12/2002 | Kim et al. ................. 438/257 |
| 2003/0181053 A1 | * | 9/2003 | Tseng et al. ............... 438/694 |

FOREIGN PATENT DOCUMENTS

| | | |
|---|---|---|
| JP | 06-077493 | 3/1994 |
| JP | 2002-033404 | 1/2002 |

OTHER PUBLICATIONS

English Translation of Official Letter from German Patent Office; German Patent Application No. 103 41 062.7–33, dated Dec. 6, 2004.

English Translation of Korean Office Action; Korean Patent Application No. 10–2002–0054460, Date of Korean Office Action Jul. 30, 2004.

* cited by examiner

*Primary Examiner*—Thao P. Le
(74) *Attorney, Agent, or Firm*—Myers Bigel Sibley & Sajovec, PA (57) ABSTRACT

Gate structures of a non-volatile integrated circuit memory device can include a thermal oxidation layer on a substrate beneath the gate structure that defines a side wall of the gate structure. An oxygen diffusion barrier layer is on the side wall of the gate structure and a floating gate is on the thermal oxidation layer and has a curved side wall portion. Related methods are also discussed.

24 Claims, 6 Drawing Sheets

Fig. 1

(PRIOR ART)

Fig. 2

(PRIOR ART)

Fig. 3

(PRIOR ART)

METHODS OF FORMING GATE STRUCTURES IN NONVOLATILE MEMORY DEVICES HAVING CURVED SIDE WALLS FORMED USING OXYGEN PATHWAYS

CLAIM FOR PRIORITY

This application claims priority to Korean Patent Application No. 10-2002-0054460, filed on Sep. 10, 2002, the entire contents of which are incorporated herein by reference.

FIELD OF THE INVENTION

This invention relates to integrated circuit devices and methods of forming integrated circuit devices in general, and more particularly, to non-volatile integrated circuit memory devices and methods of forming non-volatile integrated circuit memory devices.

BACKGROUND

Figure 1:
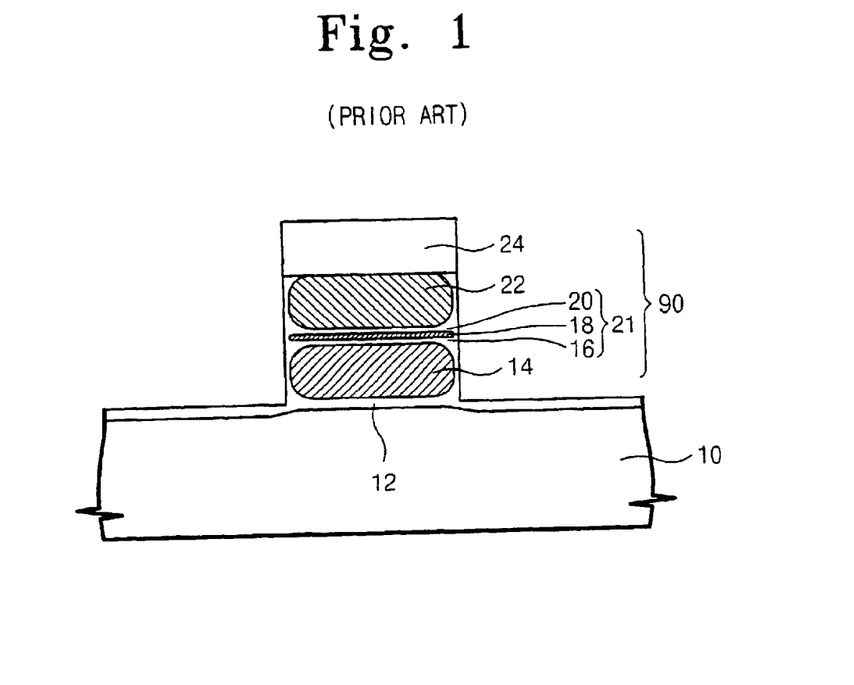
FIG. 1 is a cross-sectional view that illustrates a conventional method for forming a gate structure of a nonvolatile memory device.

A typical flash memory device can include a stacked structure including a floating gate. A method for fabricating a conventional gate structure of a nonvolatile memory device is described below with reference to FIG. 1. Referring to FIG. 1, a gate pattern 90 of a nonvolatile memory device is formed on an integrated circuit substrate 10. The gate pattern 90 includes a gate oxide layer 12, a floating gate 14, an inter-gate dielectric 21, a control gate 22, and a capping pattern 24 formed in sequence. The gate oxide layer can be a silicon oxide layer that is formed by thermally oxidizing the substrate 10. The inter-gate dielectric 21 can be made of a lower silicon oxide layer 16, a silicon nitride layer 18, and an upper silicon oxide layer 20, which can be formed in sequence. The floating gate 14 can be made of polysilicon, the control gate 22 can be made of polysilicon, and a silicide can be formed in sequence.

The gate pattern 90 can be formed by dry etching using a plasma. The plasma dry etch may damage the gate pattern 90, which may have an adverse effect on characteristics of the nonvolatile memory device. The damage from the plasma dry etch may be repaired by thermally oxidizing the gate pattern 90 to form a silicon oxide layer on sidewalls of the floating gate 14 and the control gate 22.

The thermal oxidation process can be carried out in an oxygen atmosphere at high temperature. The thermal oxidation process can cause the edges of the inter-gate dielectric 21 and gate oxide layer 12 to thicken, which can reduce a coupling ratio between the control gate 22 and the floating gate 14. The coupling ratio can reflect the efficiency of a transfer of voltage applied to the control gate 22 to the floating gate 14. Therefore, a reduced coupling ratio may necessitate increasing voltages used to operate the nonvolatile memory device.

Figure 2:
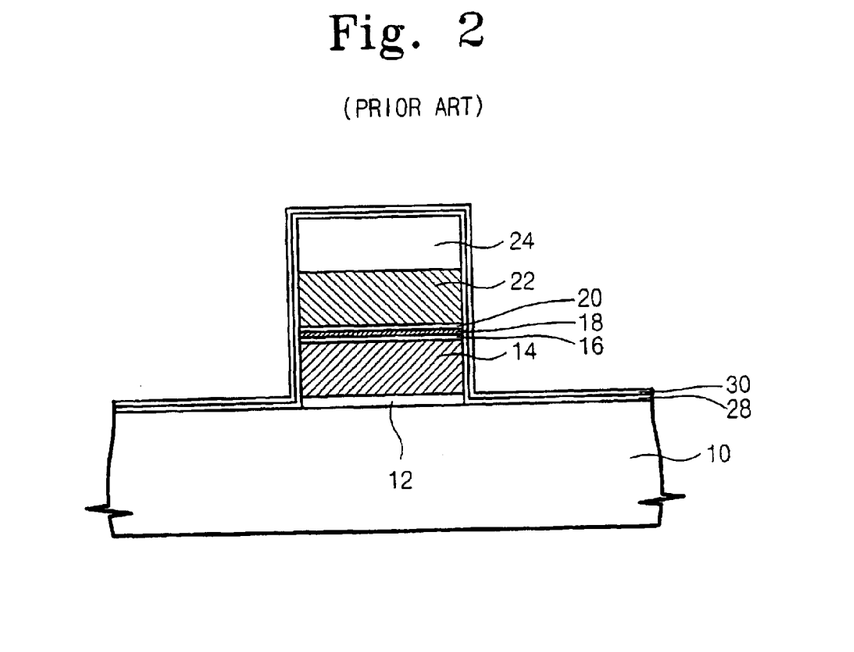
FIGS. 2 and 3 are cross-sectional views that illustrate another conventional method for forming a gate structure of a nonvolatile memory device.
Figure 3:
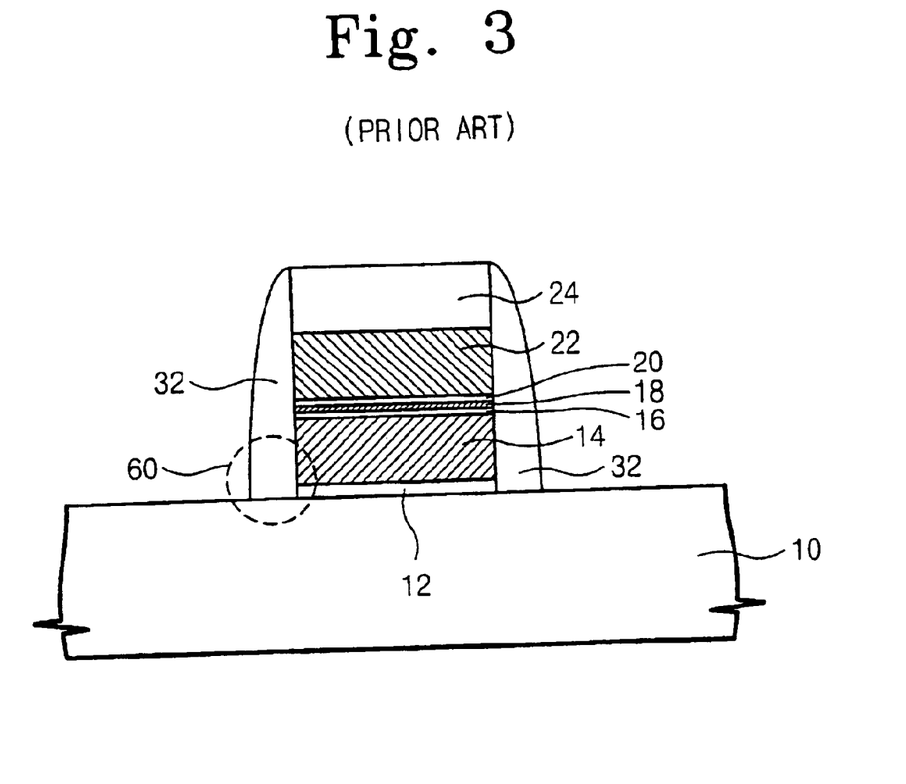

It is known to form a gate of a nonvolatile memory device using a diffusion barrier layer as disclosed in Korean Patent No. 2001-0004263, the content of which is incorporated herein by reference. FIGS. 2 and 3 are cross-sectional views illustrating conventional methods of forming nonvolatile memory device using a diffusion barrier layer as discussed in Korean Patent No. 2001-0004263.

Referring to FIG. 2, steps performed before and after a thermal oxidation process, i.e., a step of forming a gate pattern 90, can be the same as discussed above in reference to FIG. 1. Following formation of the gate pattern 90, a lower insulation layer 28 and an upper insulation layer 30 can be formed to cover an entire surface of the gate pattern 90. The lower and upper insulation layer 28 and 30 can be made of silicon oxide and silicon nitride, respectively.

The integrated circuit substrate, including the upper insulation layer 30 is thermally oxidized. The upper insulation layer 30 can provide a diffusion barrier layer that covers an entire surface of the substrate including the gate pattern 90, which can reduce or prevent the amount of oxygen atoms that reach the gate pattern 90 during the thermal oxidation process.

However, while the thermal oxidation process discussed in reference to FIG. 2 may repair damaged portions of the structure, the process may not improve the shape of the floating gate 14. The shape of the floating gate 14 can be improved as shown in FIG. 3. Referring to FIG. 3, the upper and lower insulation layers 30 and 28 can be successively removed to expose the gate pattern 90. A spacer layer is formed to cover an entire surface of the substrate including the exposed gate pattern 90. Generally, the spacer layer can be a silicon oxide layer that is formed by Chemical Vapor Deposition (CVD). The spacer layer can be anisotropically etched down to a top surface of the gate pattern 90 to form a gate spacer 32 on a sidewall of the gate pattern 90.

Because the gate spacer 32 is a silicon oxide layer that is formed by means of CVD, the electrical characteristics of the gate spacer 32 may be inferior to those of the gate oxide layer 12 formed by the thermal oxidation process. Since the floating gate 14 is protected from oxidization by the spacer 32 during the process, a lower edge 60 of the floating gate 14 may retain an angular shape and, therefore, charges stored on the floating gate 14 may be close to the gate spacer 32. The inferior electrical characteristics of the gate spacer 32 may cause electrical charges, that are otherwise accumulated on the floating gate 14, to more readily leak. Furthermore, an electric field may concentrate at the lower edge 60 of the floating gate 14 due to its angular shape, thereby possibly further increasing leakage in the nonvolatile memory device.

SUMMARY

Embodiments according to the invention, can provide gate structures in non-volatile integrated circuit memory devices having curved side walls formed using oxygen pathways. Pursuant to these embodiments, gate structures of non-volatile integrated circuit memory devices can include a thermal oxidation layer on a substrate beneath the gate structure that defines a side wall of the gate structure. An oxygen diffusion barrier layer is on the side wall of the gate structure and a floating gate is on the thermal oxidation layer and has a curved side wall portion. Related methods are also discussed.

In some embodiments according to the invention, at least a lower portion of the curved side wall portion curves away from the side wall of the gate structure toward a surface of the floating gate that faces the substrate. In some embodiments according to the invention, the surface includes a first surface, wherein the curved side wall of the floating gate further includes an upper curved side wall portion of the floating gate that curves away from the side wall of the gate structure toward a second surface of the floating gate that faces away from the substrate.

In some embodiments according to the invention, a linear portion of the side wall of the floating gate is directly coupled to the curved portion of the side wall at a first point. The first point is spaced apart from an interface between the thermal oxidation layer and the substrate by a first distance.

A linear portion of the surface that faces the substrate is spaced apart from the interface by a second distance that is less than the first distance.

In some embodiments according to the invention, the surface includes a first surface, wherein the curved side wall of the floating gate further includes an upper curved side wall portion of the floating gate that curves away from the side wall of the gate structure toward a second surface of the floating gate that faces away from the substrate. The gate structure can further include a control gate on the floating gate and an inter-gate dielectric layer between the control gate and the floating gate. The inter-gate dielectric layer can include a silicon nitride layer, wherein a linear portion of the second face is spaced apart from the silicon nitride layer by a third distance. The linear portion of the side wall of the floating gate is directly coupled to the upper curved side wall portion of the floating gate at a second point that is spaced apart from the silicon nitride layer by a fourth distance that is greater than the third distance.

In some method embodiments according to the invention, a gate structure of a non-volatile integrated circuit memory device can be formed by forming a gate structure including a floating gate on an oxide layer on a substrate and forming an oxygen diffusion barrier layer on a side wall of the gate structure above the oxide layer. A thermal oxidation layer is formed from the oxide layer beneath the floating gate and on the floating gate between the oxygen diffusion barrier layer and the floating gate to define a curved side wall portion of the floating gate.

In some embodiments according to the invention, the thermal oxidation layer is formed by forming an insulating layer on the floating gate and on the substrate beside the gate structure. The insulating layer and the oxide layer are heated to form the thermal oxidation layer on the substrate beneath the oxygen diffusion barrier layer to provide a pathway in the thermal oxidation layer through the oxygen diffusion barrier layer.

DESCRIPTION OF EMBODIMENTS
ACCORDING TO THE INVENTION

The invention now will be described more fully hereinafter with reference to the accompanying drawings, in which embodiments according to the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "beneath" another element, it can be directly under the other element or intervening elements may also be present. It will be understood that when part of an element is referred to as "outer," it is closer to the outside of the integrated circuit than other parts of the element.

It will be understood that although the terms first and second are used herein to describe various elements, the elements are not limited by these terms. These terms are used to distinguish one element from another element. Thus, a first element discussed below could be termed a second element, and similarly, a second element may be termed a first element without departing from the teachings of the invention.

It will also be understood that when an element such as a circuit, is referred to as being "connected" or "electrically connected" to another element, it can be directly connected to the other element or intervening elements may also be present. The terminology used herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. Unless otherwise defined, all terms used herein are to have their common meaning, or in the case of technical and scientific terms, to have the meaning that is commonly understood by those of ordinary skill in the art to which this invention belongs.

Figure 4:
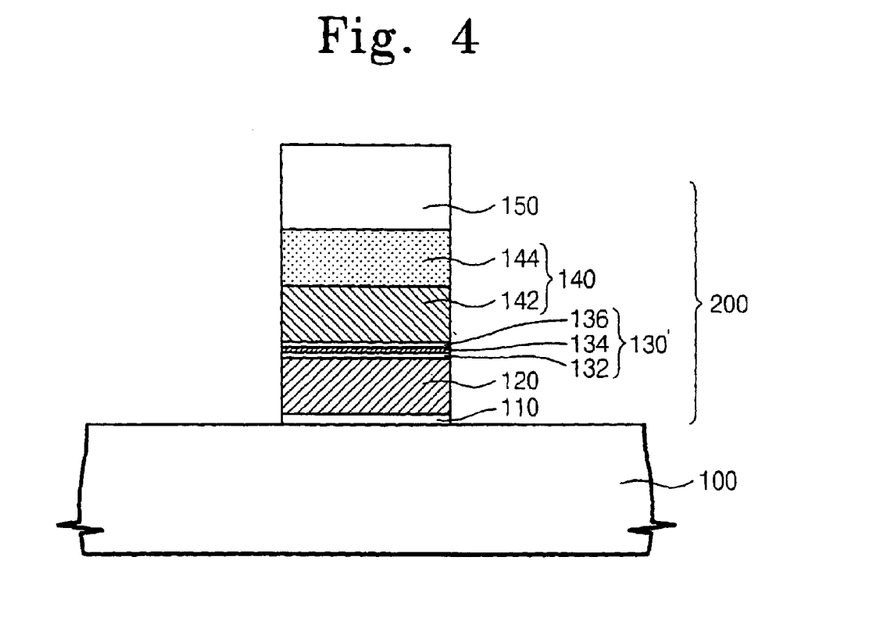
FIGS. 4–7 are cross-sectional views illustrating method embodiments of forming gate structures of nonvolatile memory devices according to the invention.

Methods of forming gate structures of nonvolatile memory devices according to the invention are described below with reference to FIGS. 4 through 7. Referring to FIG. 4, a device isolation layer (not shown) is formed at a predetermined region of an integrated circuit (e.g., semiconductor) substrate to define an active region. A gate oxide layer 110 is formed on the active region. In some embodiments according to the invention, the gate oxide layer 110 is a silicon oxide layer that is formed by thermally oxidizing the active region.

A lower conductive layer is formed on the entire surface of the integrated circuit substrate including the gate oxide layer 110. The lower conductive layer is patterned to form a lower conductive pattern on the active region. The lower conductive pattern is formed to cover the gate oxide layer 110. An inter-gate dielectric, an upper conductive layer, and a capping layer are sequentially formed on the substrate including the lower conductive pattern. The capping layer, the upper conductive layer, the inter-gate dielectric, and the lower conductive pattern are anisotropically etched to form a gate pattern 200 including: a capping pattern 150, a control gate 140, an inter-gate dielectric pattern 130, and a floating gate 120 on the gate oxide layer. The gate pattern 200 is formed across the active region. That is, the lower conductive pattern and the gate pattern 200 are formed perpendicular to each other. Accordingly, the floating gate 120 is formed to be in the shape of a square island when viewed in a top plan view.

In some embodiments according to the invention, the lower conductive layer and the floating gate 120 are polysilicon formed by chemical vapor deposition (CVD). In some embodiments according to the invention, the inter-gate dielectric pattern 130 is formed of a lower silicon oxide layer 132, a silicon nitride layer 134, and an upper silicon oxide layer 136 which are stacked in the order listed. In some embodiments according to the invention, the upper conductive layer and the control gate 140 have a multi-layer structure including a lower control gate 142 and an upper control gate 144 which are stacked in sequence. In some embodiments according to the invention, the lower and upper control gates 142 and 144 are formed of polysilicon and silicide, respectively. In some embodiments according to the invention, the capping pattern 150 is at least one material selected from the group consisting of silicon nitride, silicon oxide, and silicon oxynitride.

Figure 5:
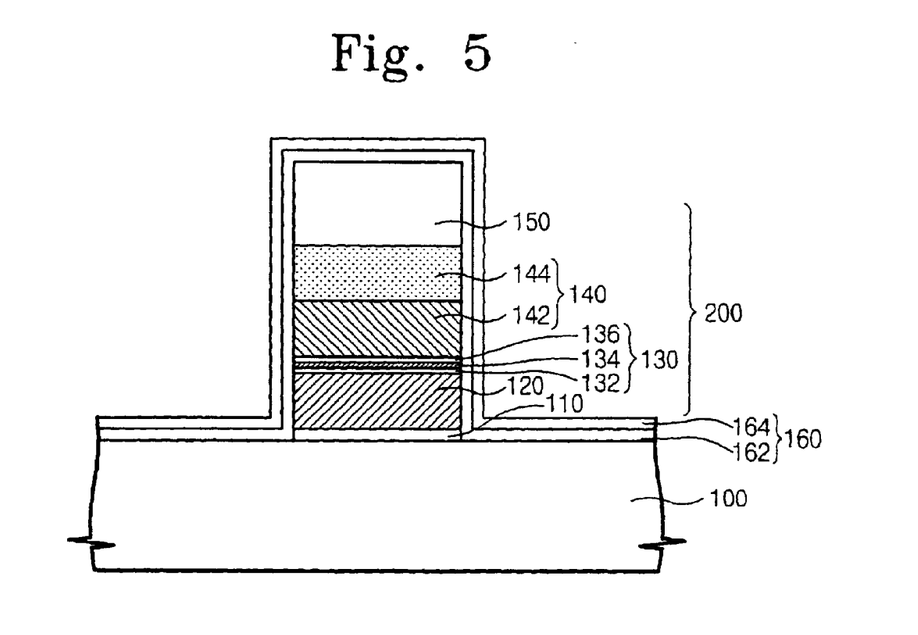

Referring to FIG. 5, a spacer insulation layer 160 is formed on the surface of the substrate and on the gate pattern 200. The spacer insulation layer 160 includes a buffer insulation layer 162 and a diffusion barrier layer 164, which are stacked in sequence. The buffer insulation layer 162 on the gate pattern defines a side wall of a gate structure that includes the gate pattern 200. In other words, the buffer insulation layer 162 is the side wall of the gate structure. In some embodiments according to the invention, the buffer insulation layer 162 and the diffusion barrier layer 164 conformally cover the gate pattern 200. Thus, it may be preferable that the buffer insulation layer 162 and the diffusion barrier layer 164 are formed using CVD. In some embodiments according to the invention, the buffer insulation layer 162 is made of silicon oxide and the diffusion barrier layer 164 is made of silicon nitride having a higher density than the silicon oxide. In some embodiments according to the invention, the buffer insulation layer 162 has a thickness of about 150 Ångstroms or less and the diffusion barrier layer 164 has a thickness of about 300 Ångstroms or less.

Figure 6:
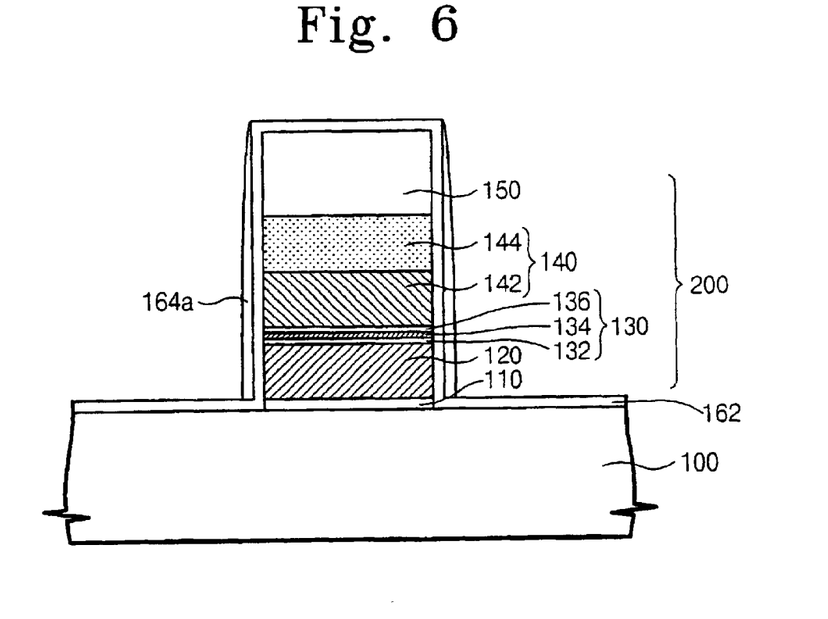

Referring to FIG. 6, the diffusion barrier layer 164 is anisotropically etched to expose the buffer insulation layer 162 on the substrate beside the gate pattern and the buffer insulation layer 162 on an upper surface of the gate pattern 200. In some embodiments according to the invention, the etching process uses an etch recipe that is selective to the buffer insulation layer 162. The etching forms a diffusion barrier spacer 164a on a side wall of the gate pattern 200. As shown in FIG. 6, the buffer insulation layer 162 on the substrate remains beneath the diffusion barrier spacer 164a after the etching to provide a pathway B through the diffusion barrier spacer 164a to the floating gate 120 and the inter-gate dielectric 130. In other words, the pathway B for the oxygen atoms is provided by the exposed portion of the buffer insulation layer 162 on the gate pattern beneath the diffusion barrier spacer 164a.

Figure 7:
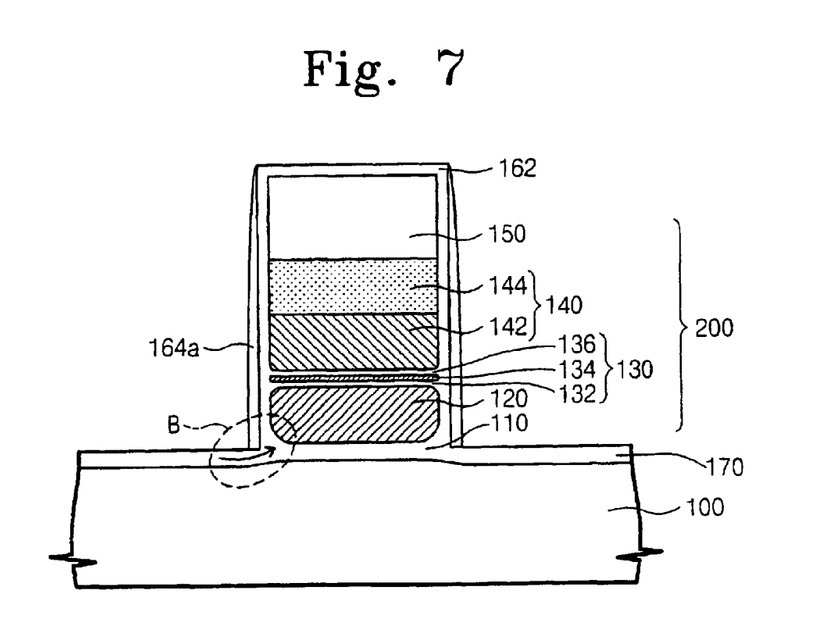

The pathway B can enable oxygen atoms included in the oxygen atmosphere used in a thermal process to reach the inter-gate dielectric pattern 130, the buffer insulation layer 162 despite the diffusion barrier spacer 164a. In some embodiments according to the invention, the diffusion barrier spacer 164a is high density silicon nitride, which may reduce or prevent oxygen atoms, or the like, from passing therethrough to reach the gate pattern 200. As shown in FIG. 7, oxygen atoms that reach the inter-gate dielectric 130 have to travel a greater distance compared to the prior art. Accordingly, statistically, a lesser amount of oxygen atoms reach the inter-gate dielectric pattern 130 because of the greater distance that the oxygen atoms must propagate, which may reduce or prevent degradation of the coupling ratio between the control gate 140 and the floating gate 120.

Referring still to FIG. 7, the substrate, including the diffusion barrier spacer 164a, is thermally oxidized in an oxygen ambient atmosphere at high temperature. As discussed above, at least some oxygen atoms can reach the gate pattern 200 via the pathway B, which may cause the gate oxide layer 110 and the inter-gate dielectric pattern 130 to thicken due to the formation of a silicon oxide layer produced by a reaction of the oxygen atoms with silicon atoms in the floating gate 120 and the control gate 140. Due to the thermal oxidation process, a thermal oxidation layer 170 coupled to the gate oxide layer 110 beneath the floating gate 120 is formed on the substrate 100 from the portion of the buffer insulation layer 162 that is exposed (i.e., not covered by the by the diffusion barrier spacer 164a). As previously described with reference to FIG. 6, the increase in thickness of the inter-gate dielectric pattern 130 can be reduced by the diffusion barrier spacer 164a blocking direct transfer of the oxygen atoms (e.g., through the diffusion barrier spacer 164a).

As shown in FIG. 7, the gate oxide layer 110/thermal oxidation layer 170 is located beneath the diffusion barrier spacer 164a on the side wall of the gate structure. Thus, a path for enabling oxygen atoms to reach the gate oxide layer 110 and the floating gate 120 is shorter than a path for the oxygen atoms to reach the inter-gate dielectric pattern 130. As a result, a thermal oxide layer can be formed on a sidewall and a corner of the floating gate 120 and a lower edge of the floating gate 120, thereby causing the floating gate 120 to have a curve side wall that curves away from the side wall of the gate structure toward a lower surface of the floating gate 120 that faces the substrate 100. As shown in FIG. 7, the of the inter-gate dielectric pattern 130 has a much lower thickness increase rate than the edge of the gate oxide layer 110.

Following removal of the diffusion barrier spacer 164a and the buffer insulation layer 162, another gate spacer may be formed on the sidewall of the gate pattern 200. Alternatively, the diffusion barrier spacer 164a may remain and be used as a gate pacer.

Prior to formation of the spacer, a doping process may be performed using the gate pattern 200 as a mask to form a lightly doped region self aligned to the gate structure. In addition, following formation of the diffusion barrier spacer 164a, a another doping process may be performed using the diffusion barrier spacer 164a as a mask to form a heavily doped region in the substrate. Alternatively, prior to the heavy doping process, another gate spacer may be formed on the diffusion barrier spacer 164a.

Referring to FIG. 7, because less oxygen reaches the portions of the gate structure that are farther removed from the pathway B, an upper portion of the side wall of the floating gate 120 is also curved, but to a lesser degree than the lower portion of the curved side wall discussed above. In particular, a side wall of the inter-gate dielectric layer 130 is also curved, but to a lesser degree than the lower side wall of the floating gate 120. Similarly, a side wall of the control gate 142 is curved, but to a lesser degree than the curved lower side wall of the floating gate 120 and the curved side wall of the silicon nitride layer. Furthermore, because less oxygen reaches the portions of the gate structure that are farther removed from the pathway B, the oxide layers that are formed by the thermal oxidation process are progressively thinner as the distance from the pathway B increases. For example, the thickness of the oxide formed from the control gate 142 is less than the thickness of the oxide from the floating gate 120. As discussed above, reducing the thickening of the oxide layer in the inter-gate dielectric layer 130 can reduce a degradation in the coupling ratio between the control gate 142 and the floating gate 120.

Figure 8:
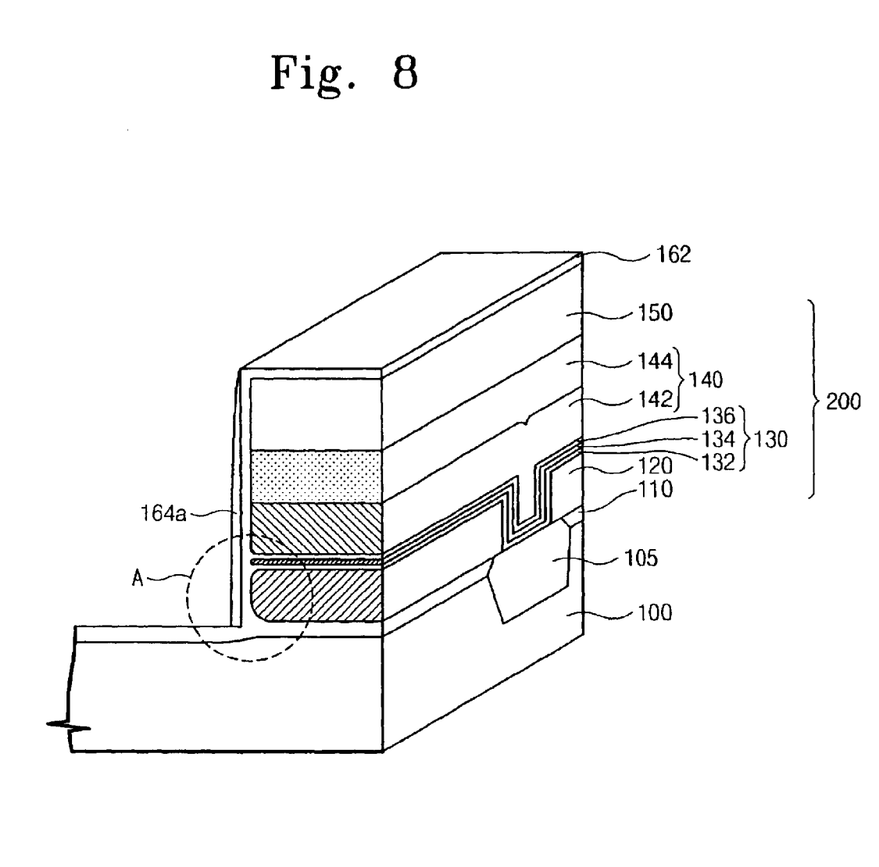
FIG. 8 is a perspective view illustrating embodiments of gate structures of nonvolatile memory devices according to the invention.
Figure 9:
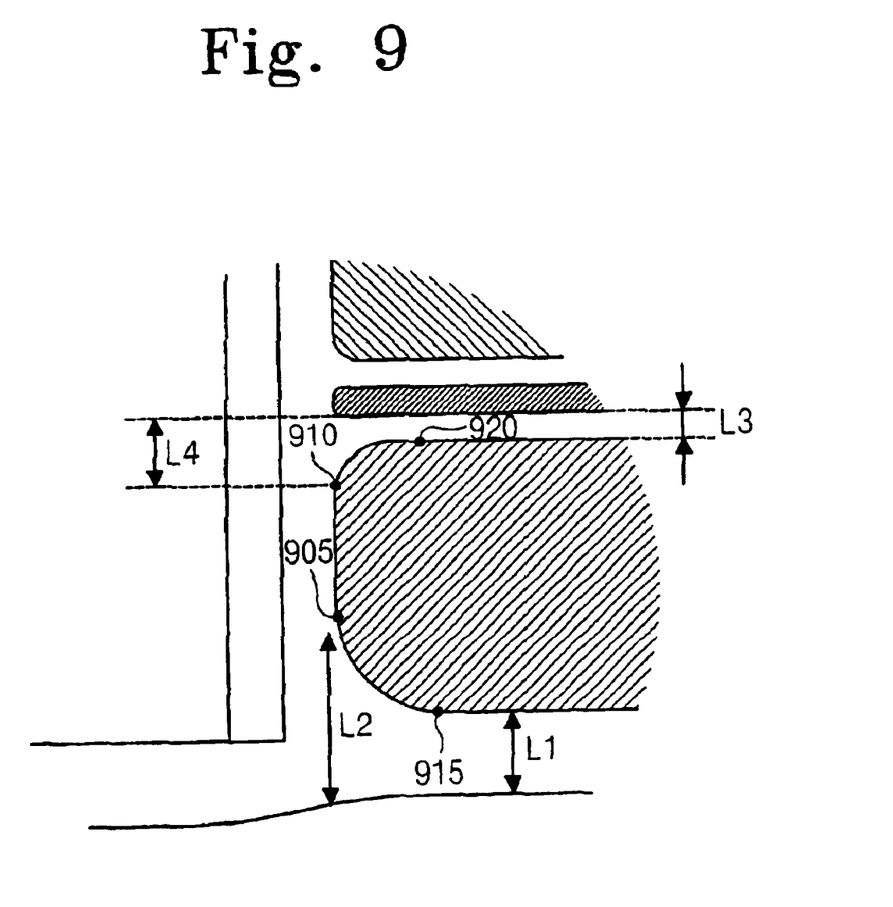
FIG. 9 is an enlarged view of a portion "A" shown in FIG. 8.

FIG. 8 is a perspective view that illustrates embodiments of gate structures in nonvolatile memory devices according to the invention. FIG. 9 is an enlarged view of a portion "A" shown in FIG. 8. Referring to FIGS. 8 9, a device isolation 105 is disposed at a predetermined region of the integrated circuit substrate to define an active region. A gate pattern 200 is disposed on the substrate including the device isolation layer 105 to cross the active region and the device isolation layer 105.

The gate pattern 200 includes a gate oxide layer 110, a floating gate 120 having a curved side wall, an inter-gate dielectric pattern 130, a control gate 140, and a capping pattern 150 which are stacked in sequence. The gate oxide layer 110 is a silicon oxide layer that is formed by means of a thermal oxidation process. A recess in the floating gate 120 exposes the device isolation layer 105. Preferably, the floating gate 120 is made of impurity-containing polysilicon. A lower portion of the curved side wall of the floating gate 120 is curved toward the substrate, which can reduce the concentration of an electric field on the lower edge.

The inter-gate dielectric pattern 130 conformally covers an upper surface and a sidewall of the floating gate 120 and the exposed surface of the device isolation layer 105. Preferably, the inter-gate dielectric pattern 130 is made of a lower silicon oxide layer 132, a silicon nitride layer 134, and an upper silicon oxide layer, which are stacked in sequence.

Preferably, the control gate 140 includes a lower control gate 142 and an upper control gate 144 which are stacked in sequence. The lower control gate 142 covers the inter-gate dielectric pattern 130 and is preferably made of polysilicon. The upper control gate 144 is preferably made of tungsten silicide but may be made of one selected from the group consisting of various metals materials and their silicide materials. The capping pattern 150 may be made of at least one material selected from the group consisting of silicon nitride, silicon oxide, and silicon oxynitride.

An upper surface and the side wall of the gate pattern 200 are covered with a buffer insulation layer 162 which is made of silicon oxide. Preferably, the buffer insulation layer 160 has a thickness of about 150 Ångstroms or less. A diffusion barrier spacer 164 is on the covered side wall of the gate pattern 200. The diffusion barrier spacer 164 is made of silicon nitride and can reduce or prevent oxygen atoms from reaching the gate pattern 200 other than via the pathway B. The gate oxide layer 110 is thicker than the inter-gate dielectric pattern 130, for example, measured at the respective centers.

In FIG. 9, "L1" denotes a center thickness of the gate oxide layer 110 beneath the floating gate 120, "L2" denotes an edge thickness of the gate oxide layer 110, "L3" denotes a center thickness of the lower silicon oxide layer 132 included in the inter-gate dielectric, and "L4" denotes an edge thickness of the lower silicon oxide layer 132. A difference between L2 and L1 (i.e., L2−L1) is greater than a difference of L4 and L3 (i.e., L4−L3). In other words, (L2−L1)>(L4−L3). This thickness difference results from an existence of the diffusion barrier spacer 164a and the pathway B.

As shown in FIG. 9, the curved side wall of the floating gate 120 includes a lower curved portion, an upper curved portion, and a linear portion that directly connects the lower curved portion to the upper curved portion. The lower curved portion is connected to the linear portion at a first point 905 on the curved side wall. The upper curved portion is connected to the linear portion at a second point 910 on the curved side wall.

The lower curved portion curves away from the side wall of the gate structure toward a lower surface of the floating gate 120 that faces the substrate. The upper curved portion curves away from the side wall of the gate structure toward an upper surface of the floating gate 120 that faces the away from the substrate. A length of the lower curved portion is greater than a length of the upper curved portion.

As shown in FIG. 9, the lower surface of the floating gate is spaced apart from an interface between the substrate and the oxide layer by a distance L1. The first point 905 (where the linear portion connects to the lower curved portion) is spaced apart from the interface between the substrate and the oxide layer by a distance L2 which is greater than L1. The upper surface is spaced apart form the silicon nitride layer by a distance L3. The second point 910 (where the linear portion connects to the upper curved portion) is spaced apart from the silicon nitride layer by a distance L4 which is greater than L3. As shown in FIG. 9, the interface between the substrate and the oxide layer can be at different locations depending which part of the gate structure is being referenced. For example, the position of the interface aligned to the side wall of the floating gate 120 is beneath the position of the interface beneath a a center region of the first surface.

In embodiments according to the invention, following formation of a diffusion barrier spacer covering a sidewall of a gate pattern, a thermal oxidation process is carried out to cure damage caused etching used to form the gate pattern. Due to the diffusion barrier spacer, a pathway B that enables oxygen atoms to reach an inter-gate dielectric pattern becomes longer compared to the prior art. Thus, the phenomenon that the inter-gate dielectric pattern becomes thicker can be reduced to improve efficiency in coupling a voltage applied to the control gate to the floating gate. Furthermore, the pathway B through the diffusion barrier spacer enables the oxygen atoms reach the floating gate to prevent a concentration of an electric field at a lower edge of the floating gate.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed:

1. A method of forming a gate structure of a non-volatile integrated circuit memory device comprising:

forming a gate structure including a floating gate on an oxide layer on a substrate;

forming an oxygen diffusion barrier layer on a side wall of the gate structure above the oxide layer; and forming a thermal oxidation layer from the oxide layer, wherein the thermal oxidation layer continuously extends from beneath the oxygen diffusion barrier layer to beneath the floating gate and on the floating gate between the oxygen diffusion barrier layer and the floating gate to define a curved side wall portion of the floating gate.

2. A method according to claim 1 wherein the step of forming a thermal oxidation layer comprises the step of:

forming an insulating layer on the floating gate and on the substrate beside the gate structure; and heating the insulating layer and the oxide layer to form the thermal oxidation layer on the substrate beneath the oxygen diffusion barrier layer to provide a pathway in the thermal oxidation layer through the oxygen diffusion barrier layer.

3. A method according to claim 2 wherein the step of forming a gate structure further comprises:

forming an inter-gate oxide layer on the floating gate; and forming a silicon nitride layer on the inter-gate oxide layer to form an inter-gate dielectric layer on the floating gate.

4. A method according to claim 3 wherein the step of forming a thermal oxidation layer further comprising forming the thermal oxidation layer in an atmosphere including oxygen atoms that reach silicon atoms included in the floating gate via the pathway in a first amount.

5. A method according to claim 4 wherein the step of forming a thermal oxidation layer further comprising forming the thermal oxidation layer in the atmosphere including oxygen atoms that reach silicon atoms included in the inter-gate dielectric layer via the pathway in a second amount that is less than the first amount.

6. A method according to claim 5 further comprising:

forming a control gate on the inter-gate dielectric layer, wherein the step of forming a thermal oxidation layer further comprising forming the thermal oxidation layer in the atmosphere including oxygen atoms that reach silicon atoms included in the control gate via the pathway in a third amount that is less than the second amount.

7. A method according to claim 1 wherein at least a lower portion of the curved side wall portion curves away from the side wall of the gate structure toward a surface of the floating gate that faces the substrate.

8. A method according to claim 7 wherein the surface comprises a first surface, wherein the curved side wall of the floating gate further comprises:

an upper curved side wall portion of the floating gate that curves away from the side wall of the gate structure toward a second surface of the floating gate that faces away from the substrate.

9. A method according to claim 7 further comprising:

a linear portion of the side wall of the floating gate directly coupled to the curved portion of the side wall at a first point, wherein the first point is spaced apart from an interface between the thermal oxidation layer and the substrate by a first distance; and wherein a linear portion of the surface that faces the substrate is spaced apart from the interface by a second distance that is less than the first distance.

10. A method according to claim 8 wherein a length of the lower curved side wall is greater than a length of the upper curved side wall.

11. A method according to claim 1 further comprising:

forming a control gate on the floating gate having a curved side wall.

12. A method according to claim 11 wherein a length of the curved side wall of the control gate is less than the length of the upper curved side wall.

13. A method according to claim 1 further comprising:

forming a control gate on the floating gate; and forming an inter-gate dielectric layer between the control gate and the floating gate including a silicon nitride layer having a curved side wall.

14. A method for fabricating a transistor of a nonvolatile memory device, comprising:

forming a gate pattern on an integrated circuit substrate, the gate pattern including a gate oxide layer, a floating gate, an inter-gate dielectric pattern, and a control gate which are stacked in the order named;

forming a diffusion barrier layer on an entire surface of an integrated circuit substrate including the gate pattern;

anisotropically etching the diffusion barrier layer to form a diffusion barrier spacer over a lateral side of the gate pattern; and thermally oxidizing an integrated circuit substrate including the diffusion barrier spacer to form a thermal oxidation layer from the oxide layer that continuously extends from beneath the oxygen diffusion barrier layer to beneath the floating gate.

15. The method as set forth in claim 14, characterized in that the inter-gate dielectric pattern is made of silicon oxide, silicon nitride, and silicon oxide which are stacked in the order named.

16. The method as set forth in claim 14, characterized in that the formation of the gate pattern comprises:

forming a device isolation layer at a predetermined region of the integrated circuit substrate to define an active region;

forming a gate oxide layer on the active region;

forming a lower conductive pattern on the gate oxide layer, the lower conductive pattern being disposed in parallel with the active region;

forming an inter-gate dielectric and an upper conductive layer on an entire surface of an integrated circuit substrate including the lower conductive pattern; and successively patterning the upper conductive layer, the inter-gate dielectric, and the lower conductive pattern, the patterning being vertical to the active region.

17. The method as set forth in claim 16, characterized in that the gate oxide layer is a silicon oxide layer which is formed by thermally oxidizing the active region.

18. The method as set forth in claim 16, characterized in that the lower conductive pattern is made of polysilicon.

19. The method as set forth in claim 16, characterized in that the upper conductive layer is made of polysilicon and silicide which are stacked in the order named.

20. The method as set forth in claim 16, before patterning the upper conductive layer, further comprising forming a capping layer on the upper conductive layer.

21. The method as set forth in claim 14, characterized in that the diffusion barrier layer is a silicon nitride layer which is formed by means of chemical vapor deposition (CVD).

22. The method as set forth in claim 14, before forming the diffusion barrier layer, further comprising forming a buffer insulation layer to cover an entire surface of an integrated circuit substrate including the gate pattern.

23. The method as set forth in claim 22, characterized in that the buffer insulation layer is a silicon nitride layer which is formed by means of CVD.

24. The method as set forth in claim 14, characterized in that the thermal oxidation is performed for a lower edge of the floating gate.

* * * * *